(12) United States Patent
Park et al.

(10) Patent No.: US 10,685,955 B2
(45) Date of Patent: Jun. 16, 2020

(54) TRENCH DIODE AND METHOD OF FORMING THE SAME

(71) Applicant: SEMICONDUCTOR COMPONENTS INDUSTRIES, LLC, Phoenix, AZ (US)

(72) Inventors: Jongho Park, Incheon (KR); Sangsu Woo, Incheon (KR); SangYong Lee, Incheon (KR); SeWoon Kim, Bucheon (KR)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/583,542

(22) Filed: Sep. 26, 2019

(65) Prior Publication Data

US 2020/0035667 A1    Jan. 30, 2020

Related U.S. Application Data

(62) Division of application No. 16/045,411, filed on Jul. 25, 2018, now Pat. No. 10,468,402.

(51) Int. Cl.
| | |
|---|---|
| *H01L 27/02* | (2006.01) |
| *H01L 29/66* | (2006.01) |
| *H01L 29/78* | (2006.01) |
| *H01L 29/866* | (2006.01) |
| *H01L 29/739* | (2006.01) |

(52) U.S. Cl.
CPC .... *H01L 27/0255* (2013.01); *H01L 29/66106* (2013.01); *H01L 29/66727* (2013.01); *H01L 29/66734* (2013.01); *H01L 29/7397* (2013.01); *H01L 29/7808* (2013.01); *H01L 29/7813* (2013.01); *H01L 29/866* (2013.01)

(58) Field of Classification Search
None
See application file for complete search history.

(56) References Cited

U.S. PATENT DOCUMENTS

| 4,429,324 A * | 1/1984 | Wilkens | H01L 29/866 |
| | | | 257/606 |
| 7,307,313 B2 | 12/2007 | Ohyanagi et al. | |
| 7,449,354 B2 | 11/2008 | Marchant et al. | |

(Continued)

*Primary Examiner* — Andres Munoz
(74) *Attorney, Agent, or Firm* — AMPACC Law Group, PLLC

(57) ABSTRACT

A method for forming a trench diode for a power semiconductor device includes forming a first trench having a first opening and a second trench having a second opening in a substrate material, the second opening of the second trench being wider than the first opening of the first trench. An insulating layer is formed over surfaces of the first and second trenches. A first semiconductor material is provided within the first and second trenches, the first semiconductor material filling the first trench at least until the first opening is entirely plugged and partially filling the second trench so that a portion of the second opening remains open, the first semiconductor material having a first conductivity type. A second semiconductor material is provided within the second trench and over the first semiconductor material, the second semiconductor material having a second conductivity type that is different from the first conductivity type.

10 Claims, 10 Drawing Sheets

(56) References Cited

U.S. PATENT DOCUMENTS

| | | |
|---|---|---|
| 7,544,545 B2 | 6/2009 | Chen et al. |
| 7,727,831 B2 * | 6/2010 | Ohtani ................ H01L 29/7813 |
| | | 438/199 |
| 7,919,347 B2 | 4/2011 | Cheng et al. |
| 8,164,162 B2 * | 4/2012 | Hsieh ................ H01L 27/0629 |
| | | 257/577 |
| 8,274,113 B1 * | 9/2012 | Hsieh .................... H01L 29/407 |
| | | 257/334 |
| 8,476,676 B2 * | 7/2013 | Chang ................ H01L 27/0259 |
| | | 257/173 |
| RE46,311 E | 2/2017 | Kawaguchi |
| 2003/0042538 A1 | 3/2003 | Kumar et al. |
| 2005/0062124 A1 | 3/2005 | Chiola |
| 2006/0071276 A1 | 4/2006 | Zundel et al. |
| 2006/0286751 A1 | 12/2006 | Urakami et al. |
| 2009/0140330 A1 | 6/2009 | Yagi et al. |
| 2009/0212354 A1 | 8/2009 | Hsieh |
| 2010/0090274 A1 | 4/2010 | Hsieh |
| 2010/0176448 A1 | 7/2010 | Hsieh |
| 2010/0219461 A1 * | 9/2010 | Rinehimer .......... H01L 27/0727 |
| | | 257/328 |
| 2011/0291186 A1 | 12/2011 | Yilmaz et al. |
| 2013/0075810 A1 | 3/2013 | Hsieh |
| 2015/0041816 A1 | 2/2015 | Wood et al. |
| 2015/0137220 A1 | 5/2015 | Li et al. |
| 2017/0278837 A1 | 9/2017 | Hsieh |
| 2017/0345813 A1 * | 11/2017 | Strachan ............. H01L 27/0255 |

\* cited by examiner

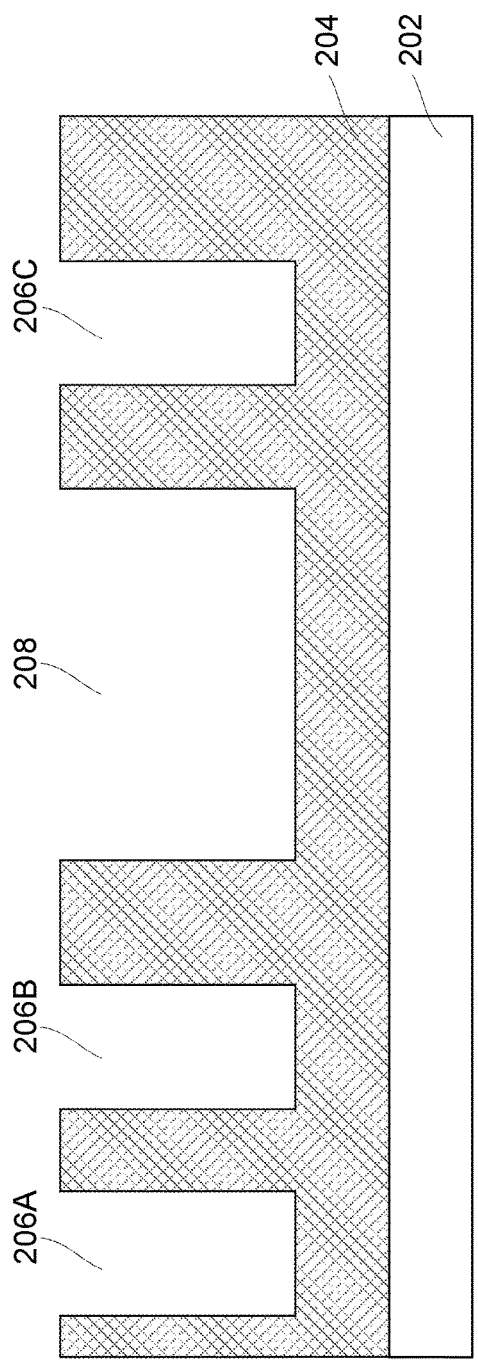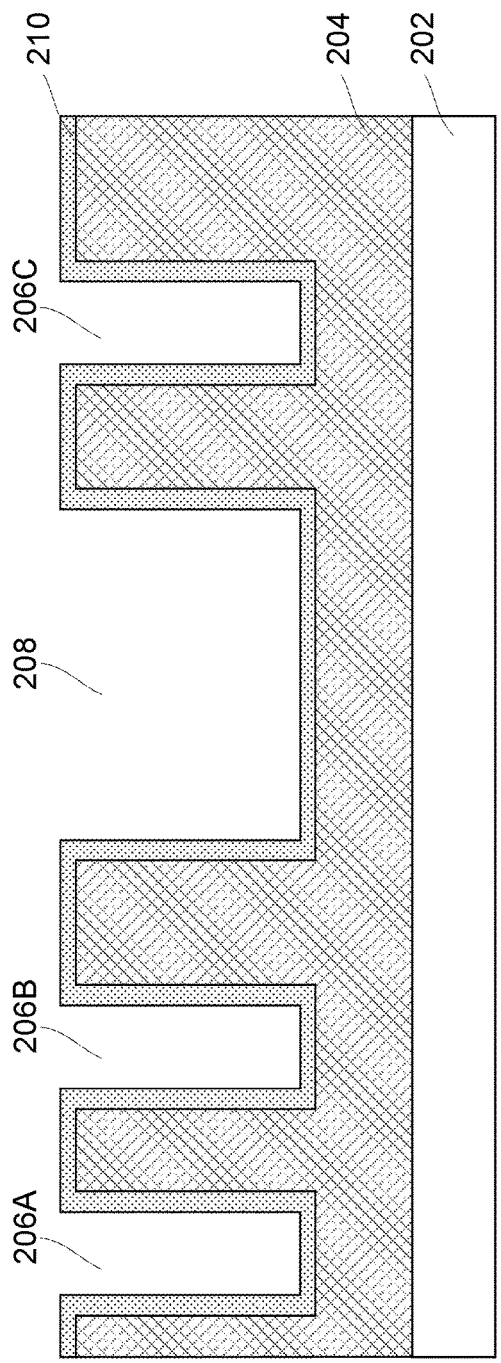
FIG. 2A
FIG. 2B

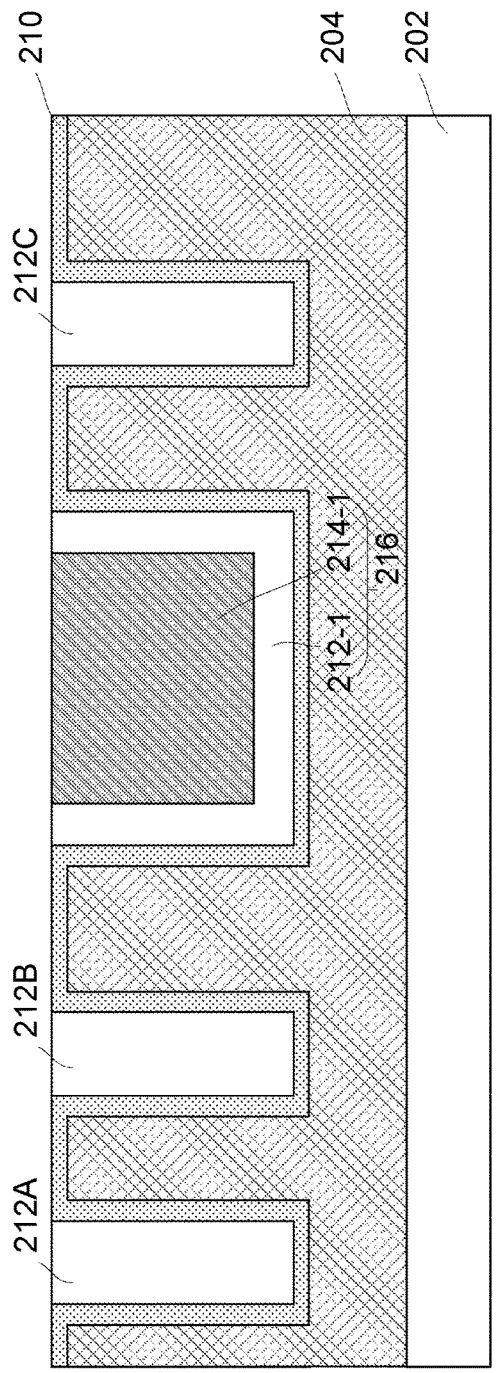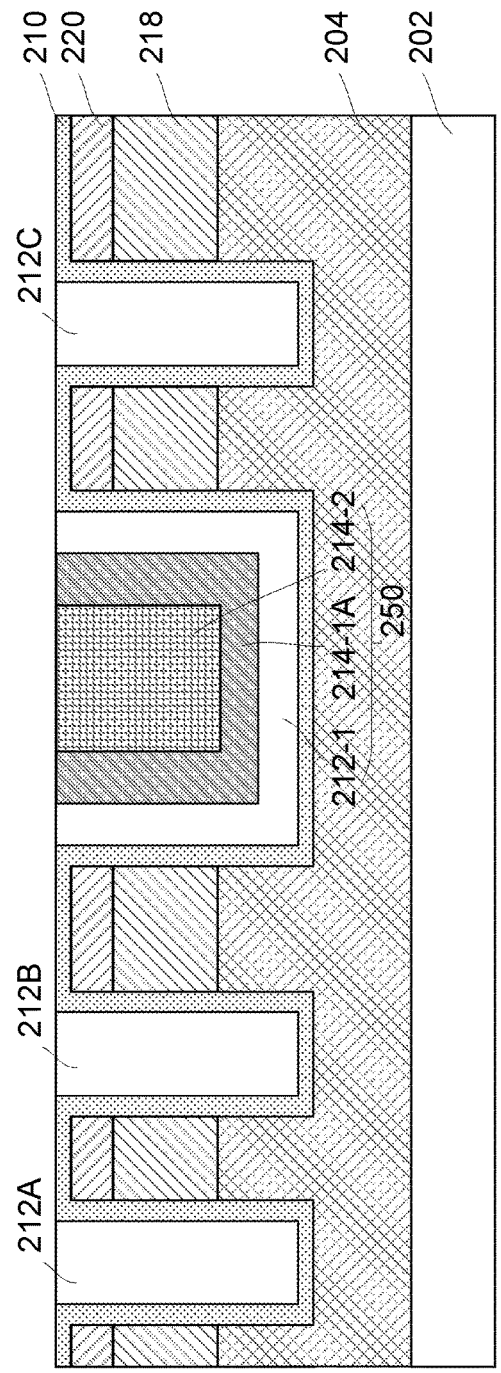
FIG. 2E
FIG. 2F

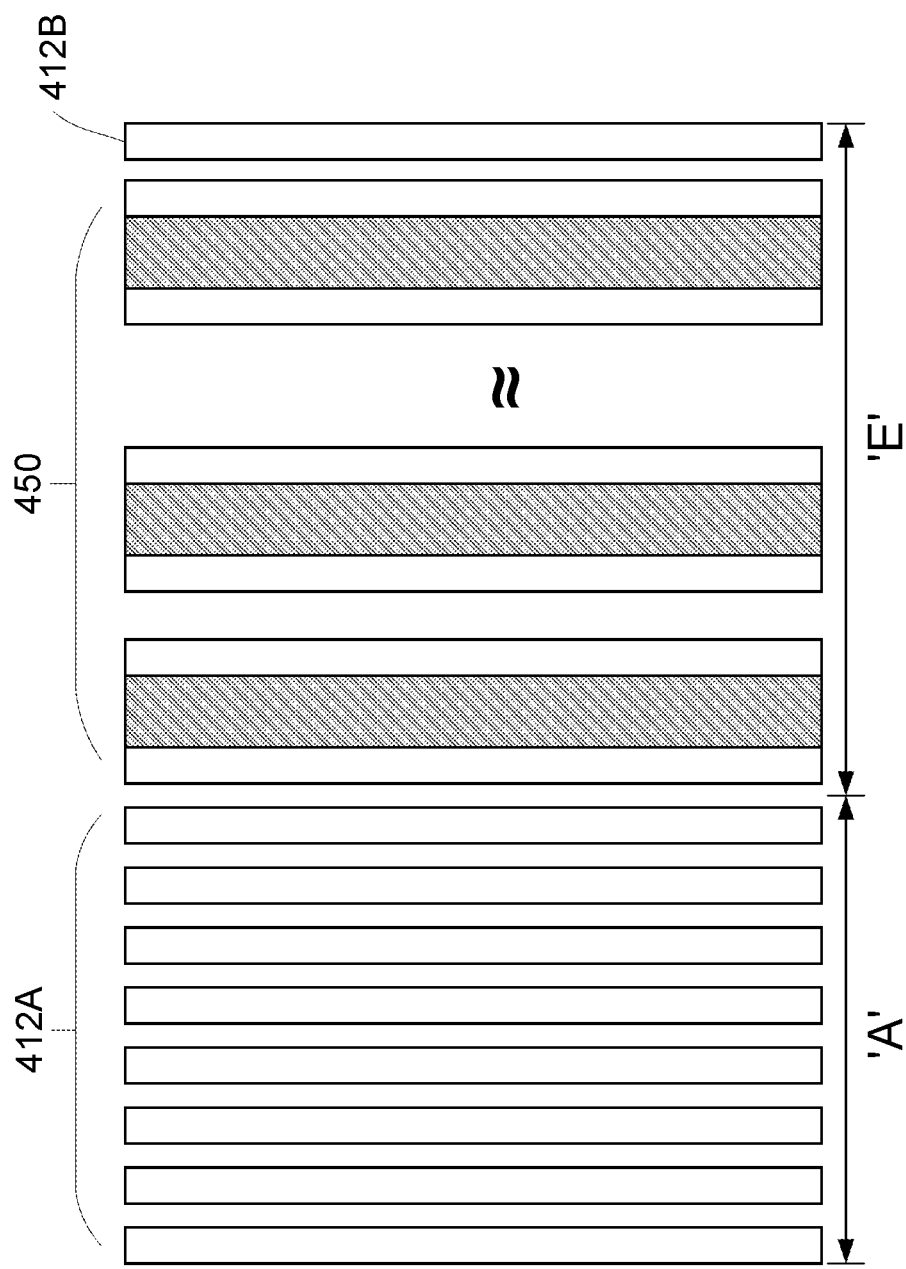

TRENCH DIODE AND METHOD OF FORMING THE SAME

CROSS-REFERENCE TO RELATED APPLICATIONS

The present application is a divisional of and claims priority to U.S. application Ser. No. 16/045,411, filed Jul. 25, 2018, the contents of which are incorporated by reference herein for all purposes.

BACKGROUND

The present disclosure relates to a trench diode, a power semiconductor device including a trench diode, and a method for forming the trench diode.

Power semiconductor devices are used in many different industries. Some of these industries, such as telecommunications, computing, and charging systems, are rapidly developing. Those industries would benefit from improved semiconductor device characteristics, including reliability, switching speed, and miniaturization.

Power semiconductor devices use a Zener diode for electrostatic discharge (ESD) protection or clamping when performing inductive switching. A conventional Zener diode is a surface-formed Zener diode that is formed on a thick insulator over a trench gate of a MOSFET, i.e., after gate polysilicon has been formed in a trench. Therefore, the surface-formed Zener diode needs additional poly deposition and masking implantation after the trench MOSFET formation. In addition, since the conventional surface-formed Zener diode is formed over the trench MOSFETs, the conventional surface-formed Zener diode adds to surface topology, which makes it more difficult to pattern small features during lithography. The conventional surface-formed Zener diode, due to its added height, also triggers step coverage issues when multiple metal deposition processes are performed.

SUMMARY

Embodiments of the present application relate to a trench diode, a power semiconductor device having the trench diode, and a method of forming the trench diode, where the trench diode is formed in an epi layer when a gate polysilicon (or gate structure) is formed in the epi layer. In an embodiment, the trench diode is a Zener diode.

A method for forming a trench diode for a power semiconductor device includes forming a first trench having a first opening and a second trench having a second opening in a substrate material, the second opening of the second trench being wider than the first opening of the first trench. An insulating layer is formed over surfaces of the first and second trenches. A first semiconductor material is provided within the first and second trenches, the first semiconductor material filling the first trench at least until the first opening is entirely plugged with the first semiconductor material and partially filling the second trench so that a portion of the second opening remains open, the first semiconductor material having a first conductivity type. A second semiconductor material is provided within the second trench and over the first semiconductor material, the second semiconductor material having a second conductivity type that is different from the first conductivity type. The first semiconductor material and the second semiconductor material are provided within the second trench and define a P-N junction of the trench diode.

In an embodiment, a power semiconductor device includes a gate structure defined in a first trench provided in a substrate material, the first trench having a first width. A diode is defined in a second trench provided in the substrate material, the second trenching having a second width that is wider than the first width. A first electrode is provided over a first side of the substrate material and electrically coupled to a source region. A second electrode is provided over the first side of the substrate material and electrically coupled to the diode.

In another embodiment, a Zener trench diode includes a first trench provided in a substrate material. An insulating layer is provided over surfaces of the first trench. A first semiconductor material of a first conductivity type is provided within the first trench, the first semiconductor material having a doping concentration of at least $1 \times 10^{18}$. A second semiconductor material of a second conductivity type is provided within the first trench and disposed over the first semiconductor material in the first trench, the second semiconductor material having a doping concentration of at least $1 \times 10^{17}$.

BRIEF DESCRIPTION OF THE DRAWINGS

FIGS. 2A to 2H illustrate a method of forming a power semiconductor device according to an embodiment of the present disclosure.

FIG. 4 is a plan view schematically illustrating a layout of a power semiconductor device according to an embodiment of the present disclosure.

DETAILED DESCRIPTION

Embodiments of the present application relate to a trench diode, a power semiconductor device having the trench diode, and a method of forming the same. The trench diode, e.g., a Zener diode, is formed in a semiconductor material (e.g., an epi layer) by forming a diode trench in the epi layer when a trench for a gate structure is formed in the epi layer. Since the trench diode is formed in the epi layer, the upper surfaces of the trench diode and the gate structure are substantially flushed to the upper surface of the epi layer (or substantially co-planar), thereby eliminating step coverage issues.

In an embodiment, a trench diode is a Zener diode provided as part of a power semiconductor device. The trench diode is configured to have a very thin depletion region, e.g., less than 1 µm, and allow the current to flow both in the forward as well as in the reversed direction. The trench diode has a P-N junction defined within a trench in a substrate material. The substrate material may include an epi layer. An insulating layer is provided over the surfaces of the trench. A first semiconductor material of a first conductivity type fills a first portion of the trench, and a second semiconductor material of a second conductivity type fills a second portion of the trench, wherein first semiconductor material and the second semiconductor material define a P-N junction for the trench diode. The insulating layer is disposed between the first semiconductor material and the substrate material. In an embodiment, the trench diode has a breakdown voltage is no more than 6 volts, 5 volts, 4 volts, or 3 volts according to implementation.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1A:
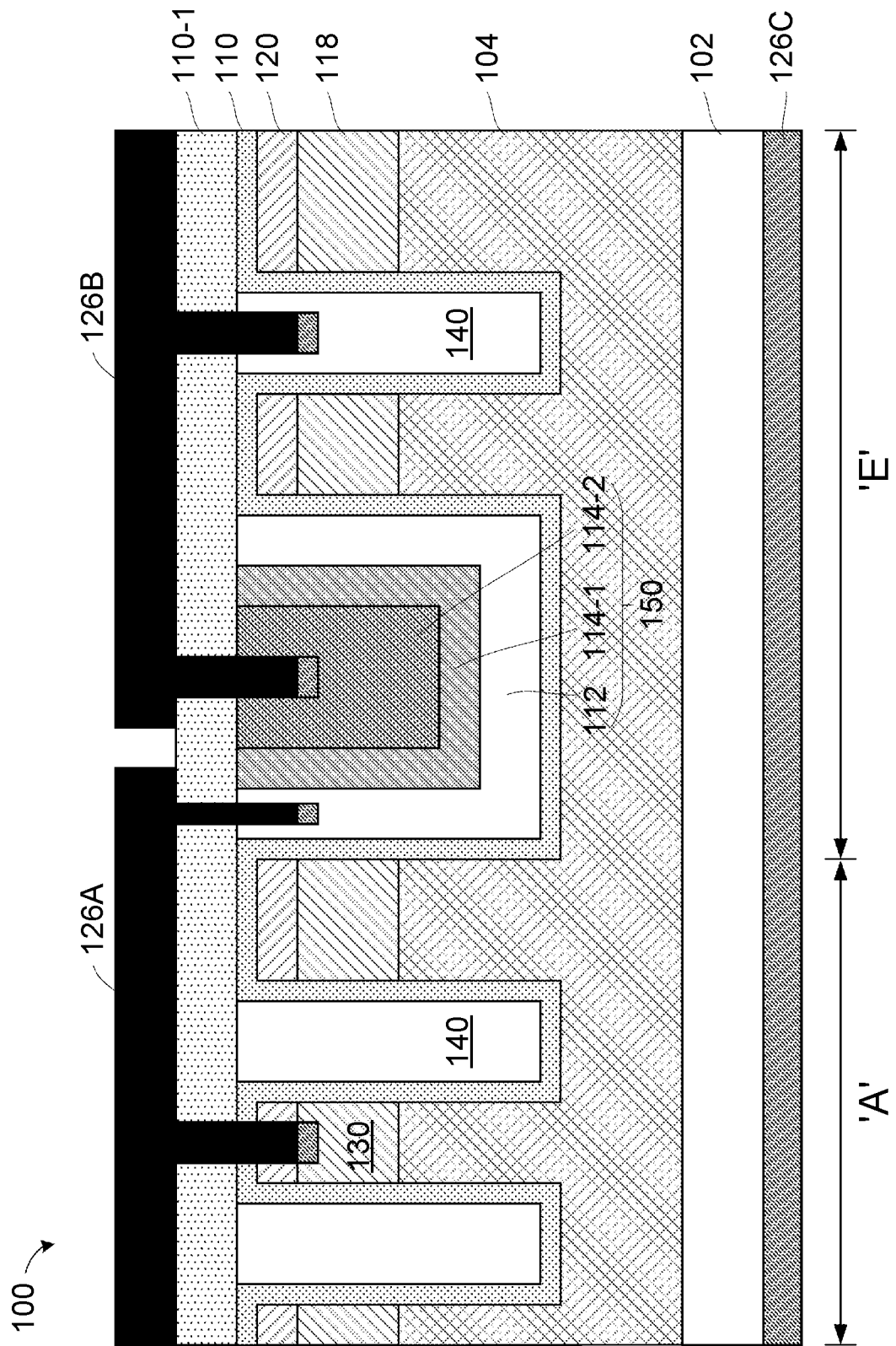
FIG. 1A illustrates a power semiconductor device according to an embodiment of the present disclosure.

FIG. 1A illustrates a power semiconductor device 100 according to an embodiment of the present disclosure. In the present embodiment, the power semiconductor device 100 is a power metal oxide semiconductor field effect transistor (MOSFET) device having a trench diode. In another embodiment, the power semiconductor device 100 may be another power semiconductor device such as an insulated gate bipolar transistor (IGBT) device. If the power semiconductor device 100 is an IGBT, it would have an additional P+ substrate or layer, as would be understood by one skilled in the art.

The power semiconductor device 100 includes a semiconductor substrate 102, for example, a silicon substrate. In other embodiments, the substrate 102 may be a substrate including another semiconductor material, such as a group IV semiconductor substrate, a group III-V compound semiconductor substrate, or a group II-VI oxide semiconductor substrate. For example, the group IV semiconductor substrate may include a silicon substrate, a germanium substrate, or a silicon-germanium substrate. The substrate 102 may also include an epi layer according to implementation.

An epitaxial layer 104 (or epi layer) is provided over the substrate 102. In an embodiment, the epi layer 104 has a first conductivity type. In another embodiment, the epi layer 104 has a second conductivity type that is opposite to the first conductivity type. A plurality gate structures 140 and a trench diode 150 are formed in the epi layer.

In an embodiment, the power semiconductor device 100 is an n-MOSFET. Therefore, the substrate 102 is an N+ type doped substrate, and the epi layer 104 is a lightly n-doped epitaxial layer, i.e., an N− type doped epitaxial layer.

In another embodiment, the power semiconductor device 100 may be a p-MOSFET, having layers of opposite conductivity type to those of the n-MOSFET based power semiconductor device. For example, a P+ type doped substrate would be used as the substrate 102, and a P− type doped epitaxial layer would be used as the epi layer 104.

The epi layer 104 has a plurality of gate trenches and one or more diode trenches (only one is shown in FIG. 1A for illustrative convenience). The diode trench is disposed between the gate trenches and has a width greater than widths of the gate trenches. In an embodiment, the diode trench 150 (e.g., an opening of the diode trench 150) is at least 2.5 times wider than the gate trench 140 (e.g., an opening of the gate trench 140). In another embodiment, the diode trench is at least 3.0 times or 3.5 times wider than the gate trench depending on implementation. The width of the diode trench is configured to be substantially larger than the gate trench, so that the same semiconductor material can be used to form the gate structures and the trench diode, as will be explained below. The sizes of the trench widths and the deposition thickness of the semiconductor material may be adjusted according to implementation.

The diode trench has a first material layer 112, a second material layer 114-1, and a third material layer 114-2. The first material layer 112 is disposed along the bottom and side surfaces of the diode trench and includes a first semiconductor material, e.g., a first polysilicon material. The first polysilicon material has the first conductivity type, e.g., the N type conductivity. In an embodiment, the first material layer 112 has a doping concentration of at least $1\times10^{18}/cm^3$ (e.g., $5\times10^{18}/cm^3$ or higher).

The second material layer 114-1 is disposed on the first material layer 112 and includes a second semiconductor material, e.g., a second polysilicon material. The second polysilicon material has the second conductivity type, e.g., the P type conductivity. In an embodiment, the second material layer 114-1 has a doping concentration of about $1\times10^{17}/cm^3$ to about $1\times10^{18}/cm^3$.

The third material layer 114-2 is disposed on the second material layer 114-1 and includes a highly doped material having the second conductivity type. In an embodiment, the third material layer 114-2 has a doping concentration of about $1\times10^{17}/cm^3$ to about $1\times10^{18}/cm^3$. The second material layer 114-1 and the third material layer 114-2 have the same conductivity type; however, the doping concentration of impurities in the third material layer 114-2 is higher than the doping concentration of impurities in the second material layer 114-1. The first to third material layers 112, 114-1, and 114-2 filling the diode trench form a trench diode 150. In an embodiment, the third material layer 114-2 is used to provide additional impurities to increase the doping concentration of the trench diode 150 to address any leakage problem and/or diffusion issue.

In an embodiment, the trench diode 150 is a Zener diode having a highly doped P-N junction in the diode trench and is configured to have a depletion region of less than 1 μm, allowing the current to flow in the forward and also in the reversed direction.

In an embodiment, the trench diode 150 is disposed between a gate structure 140 in an active area 'A' and a gate structure 140 in an ESD area 'E' (e.g., a peripheral area) when the trench diode 150 is used as an ESD diode. The active area A represents an area in which MOSFETs are formed, and the ESD area E represents an area in which ESD related components such as the trench diode 150 are formed. In an embodiment, the ESD area (or the peripheral area) is provided in a dummy region of the power device.

An insulating layer 110 lines bottom and side surfaces of each of the gate trenches and the diode trench. In an embodiment, the insulating layer 110 is formed after the gate trenches and the diode trench have been formed and before the gate trenches and the diode trench are filled with the first and second polysilicon materials. The insulating layer 110 is disposed between the gate structures 140 and the epi layer 104 and between the first material layer 112 of the trench diode 150 and the epi layer 104. In an embodiment, the insulating layer 110 includes an LOCOS (localized oxidation of silicon) oxide. In another embodiment, the insulating layer 110 is formed by depositing an insulating material along a profile of a resultant structure including the gate trenches and the diode trench. The insulating layer 110 is provided with a sufficient thickness to avoid a breakdown between the trench diode 150 and the substrate 102.

Body regions (or well regions) 118 of MOSFETs are provided in the epi layer 104. In an embodiment, the gate trenches and the diode trench extend through the body regions 118. The body regions 118 have the second conductivity type, e.g., the P type conductivity. In an embodiment, impurities having the second conductivity type are implanted into the epi layer 104 to form the body regions 118 in the epi layer 104.

High impurity regions 120 are disposed in the upper regions of the body regions 118. In an embodiment, the high impurity regions 120 serve as source regions of an n-MOSFET. The high impurity regions 120 include a material having the first conductivity type, and thus the high impurity regions 120 are N+ impurity regions. In an embodiment, the high impurity regions 120 are formed using an Arsenic implantation and diffusion process.

A source electrode 126A connects the trench diode 150 and a body region (or source region) 130 in the active area A, and a gate electrode 126B connects the trench diode 150 and the gate structure 140 in the ESD area E. In the present embodiment, the source electrode 126A serves as a cathode of the trench diode 150, and the gate electrode 126B serves as an anode of the trench diode 150. In an embodiment, the source electrode 126A and the gate electrode 126B include a conductive material such as aluminum. In an embodiment, a drain electrode 126C is provided over the substrate 102 on the opposing side of the source electrode 126A.

An interlayer insulating layer 110-1 is provided between the source and gate electrodes 126A and 126B and the underlying structure including, for example, the gate structures 140 and the trench diode 150.

Figure 1B:
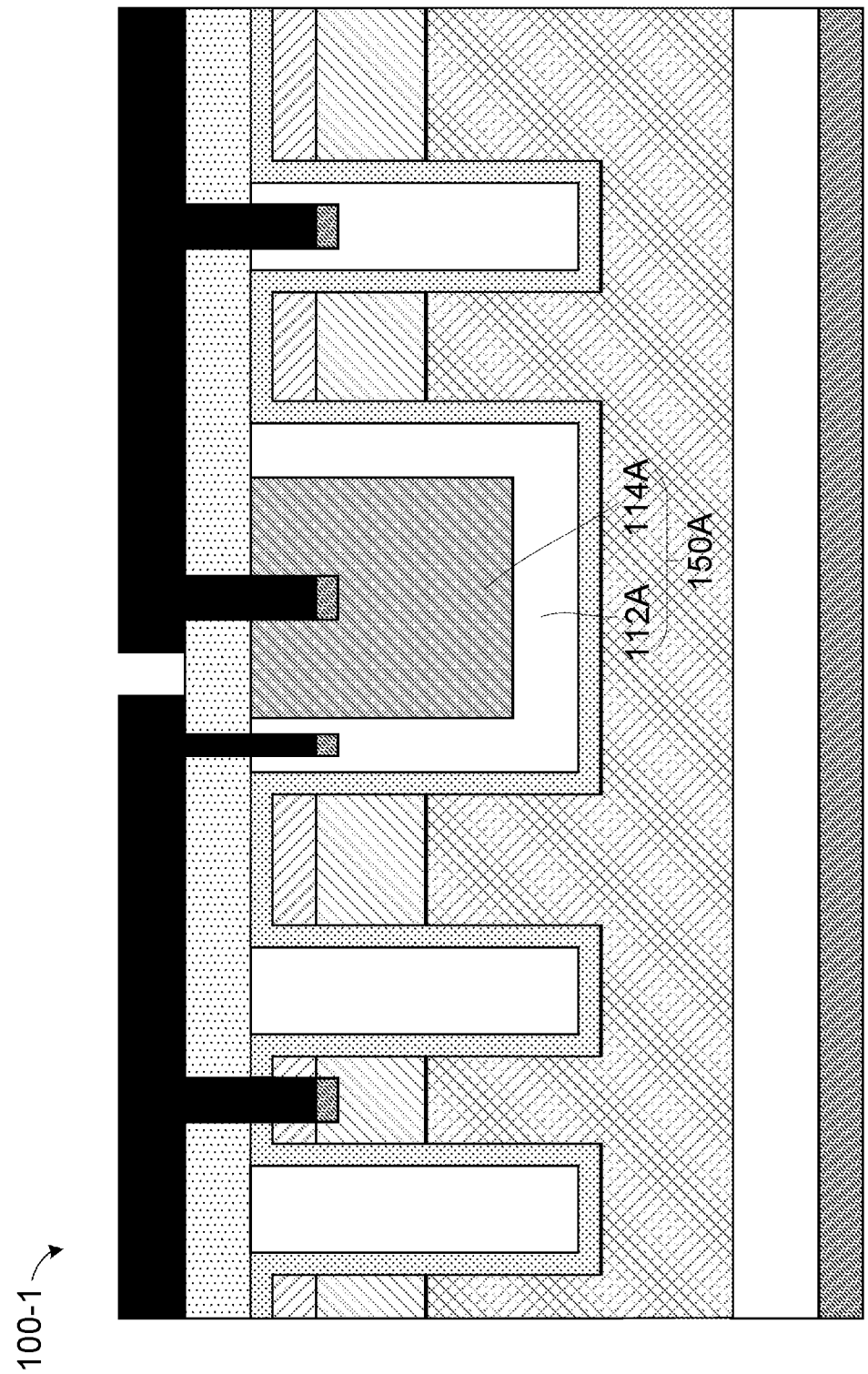
FIG. 1B illustrates a power semiconductor device according to another embodiment of the present disclosure.

FIG. 1B illustrates a power semiconductor device 100-1 having a trench diode 150A according to another embodiment of the present disclosure. A source electrode is provided over a first side of the substrate, and a drain electrode is provided over a second side (or opposing side) of the substrate. The trench diode 150A includes a first material layer 112A and a second material layer 114A. The trench diode 150A does not include a third material layer, unlike the trench diode 150 shown in FIG. 1A. In this embodiment, the first material layer partially 112A fills a portion of a diode trench, and the second material layer 114A fills the remaining portion of the diode trench. The trench diode 150A may be a Zener diode having a depletion region of no more than 1 μm. In an embodiment, the trench diode has a breakdown voltage is no more than 6 volts, 5 volts, 4 volts, or 3 volts according to implementation.

FIGS. 2A to 2H illustrate a method for forming a power semiconductor device 200 according to an embodiment of the present disclosure. For illustrative convenience, it is assumed that the power semiconductor device 200 is an n-MOSFET.

In FIG. 2A, a substrate material is provided. The substrate material may include a semiconductor substrate 202 and a semiconductor layer 204. In an embodiment, the substrate 202 is silicon. In other embodiments, the substrate 202 may be a substrate including any of other semiconductor materials, e.g., a group IV semiconductor substrate, a group III-V compound semiconductor substrate, or a group II-VI oxide semiconductor substrate. The group IV semiconductor substrate may include a silicon substrate, a germanium substrate, or a silicon-germanium substrate. The substrate 202 may be a highly doped layer having N type conductivity, e.g., an N++ doped substrate. The substrate 202 may also include an epi layer according to implementation.

In an embodiment, the semiconductor layer 204 is an epi layer grown over the substrate 202 and provided with N type impurities to convert the epi layer into the N type conductivity. In order to convert the epi layer into the N type conductivity, the N type impurities are implanted into the epi layer and annealed to facilitate the diffusion of the N type impurities. In another embodiment, the semiconductor layer 204 may be provided with the N type impurities while it is being formed, and thus the implantation step may be skipped.

After the N type epi layer 204 is formed, a plurality of trenches is formed in the epi layer 204. In this embodiment, the trenches formed include gate trenches for gate structures and a diode trench 208 for a trench diode. For illustrative convenience, FIG. 2A shows the gate trenches that include first and second gate trenches 206A and 206B formed in an active area and a third gate trench 206C formed in an ESD area. The diode trench 208 is formed in the ESD area between the second gate trench 206B and the third gate trench 206C. A width of the diode trench 208 is greater than widths of the gate trenches 206A to 206C. For example, the diode trench 208 is at least 2.5 times wider than the gate trenches 206A to 206C. In another embodiment, the diode trench 208 (e.g., an opening of the diode trench) is at least 3.0 times or 3.5 times wider than the gate trenches 206A to 206C (e.g., an opening of the gate trench) depending on implementation. In this embodiment, the diode trench 208 is used as an ESD trench diode. However, embodiments are not limited thereto. In other embodiments, the diode trench 208 is part of a trench diode used for a clamping function or for a temperature sensing function.

In FIG. 2B, an insulating layer 210 is formed along exposed surfaces of a resultant structure that includes the gate trenches 206A to 206C and the diode trench 208. In an embodiment, the insulating layer 210 may include an LOCOS oxide that is formed by oxidizing exposed surface portions of the N type epi layer 204 in which the gate trenches 206A to 206C and the diode trench 208 are formed. In another embodiment, the insulating layer 210 is formed by depositing an insulating material along the exposed surfaces of the resultant structure of FIG. 2A.

In an embodiment, a thickness of the insulating layer 210 may be determined by considering a breakdown voltage (BV) of the n-MOSFET. In an embodiment, the thickness of the insulating layer 210 is in a range of 180 angstroms to 300 angstroms when the BV of the n-MOSFET is in a range of 10 V to 30 V. In another embodiment, the thickness of the insulating layer 210 is in a range of 500 angstroms to 1500 angstroms when the BV of the n-MOSFET is in a range of 40 V to 150 V.

Figure 2C:
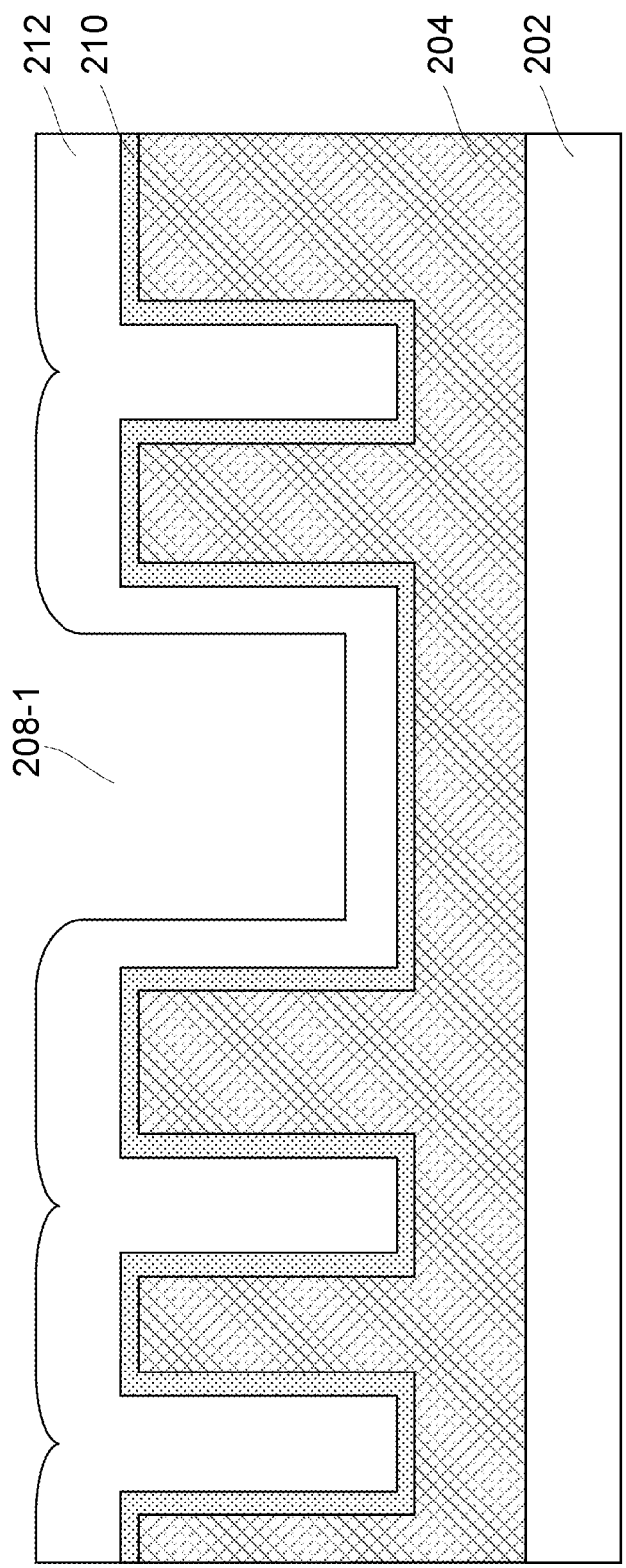

In FIG. 2C, a first conductive layer, e.g., a first polysilicon layer 212, is deposited over the insulating layer 210. The first polysilicon layer 212 may have a doping centration of about $5 \times 10^{18}/cm^3$ to about $1 \times 10^{20}/cm^3$. In an embodiment, the first polysilicon layer 212 fully fills the gate trenches 206A to 206C and partially fills the diode trench 208 (or fills a first portion of the diode trench 208). In the diode trench 208, the first polysilicon layer 212 is deposited along a profile of the diode trench 208 while leaving a second portion of trench body 208-1 unfilled. The first polysilicon layer 212 is deposited to a given thickness that is sufficient to completely fill the gate trenches 206A to 206C but not the diode trench 208. That is, the opening of the diode trench is entirely plugged with the first semiconductor material, and a portion of the opening of the gate trench remains open. The first polysilicon layer 212 corresponds to a polysilicon layer for forming a gate poly (or a gate structure). The first polysilicon layer 212 has the N type conductivity. A deposition thickness of the first polysilicon layer 212 may be changed according to implementation, e.g., depending on the widths of the gate trenches 206A to 206C and the diode trench 208. In an embodiment, the first portion of the diode trench 208 that is filled with the first polysilicon layer 212 may correspond to around 30% to around 50% of the width of the diode trench 208.

Figure 2D:
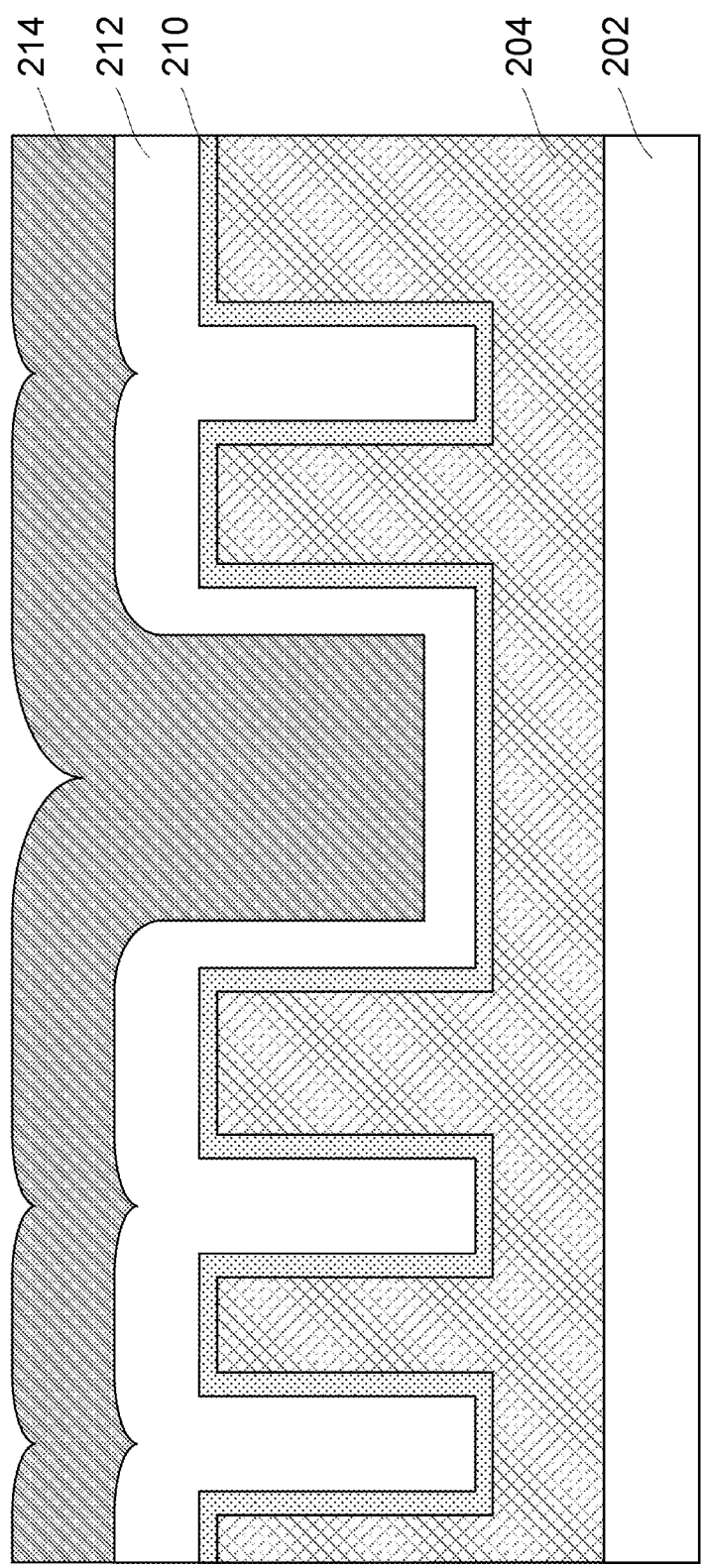

In FIG. 2D, a second conductive layer, e.g., a second polysilicon layer 214, is deposited over the first polysilicon layer 212 to fill the second portion of the diode trench body 208-1 that remains unfilled by the first polysilicon layer 212. A conductive type of the second polysilicon layer 214 is opposite to that of the first polysilicon layer 212, so that the diode trench 208 would have a P-N junction therein. In an embodiment, the second polysilicon layer 214 has the P type conductivity, and fully fills the remaining diode trench portion 208-1. The second polysilicon layer 214 may have a doping centration of about $1\times10^{17}/cm^3$ to about $1\times10^{18}/cm^3$.

In another embodiment, the second polysilicon layer 214 partially fills the second portion of the diode trench body 208-1. The diode trench 208 is provided with one or more additional materials to fully fill the diode trench. For example, a third conductive layer is provided or deposited to fully fill the remaining portion (e.g., a third portion) of the diode trench body 208-1.

In FIG. 2E, a planarization process is performed on the first polysilicon layer 212 and the second polysilicon layer 214 filling the trenches and covering the insulating layer 210 until the insulating layer 210 is exposed. The resulting upper surfaces of the first polysilicon layer 212 and the second poly silicon layer 214 are substantially co-planar to each other. In an embodiment, the planarization process includes a chemical mechanical polishing (CMP) process. The planarization process may also include an etch back process and, e.g., the CMP is performed after the etch back process.

As a result of the planarization process, gate regions 212A to 212C and a diode region 216 are formed. The gate regions 206A to 206C are filled with the first polysilicon layer 212, and the diode region 216 includes a first polysilicon portion 212-1 and a second polysilicon portion 214-1. In the diode region 216, the first polysilicon portion 212-1 includes the first polysilicon layer 212, and the second polysilicon portion 214-1 includes the second polysilicon layer 214. The first polysilicon portion 212-1 is disposed between the insulating layer 210 and the second polysilicon portion 214-1. By performing the planarization process, upper surfaces of the gate regions 212A to 212C and the diode region 216 are level (or substantially co-planar) with a top surface of the insulating layer 210 that is exposed by the planarization.

In FIG. 2F, an implantation process (or body implantation process) is performed to form body regions (wells) 218 in portions of the N type epi layer 204 that are disposed between the gate regions 212A to 212C and the diode region 216 in a lateral direction parallel to a top surface of the substrate 202. In this embodiment, P type impurities are implanted into the portions of the N type epi layer 204 to form the body regions 218 in the N type epi layer 204, each of the body regions 218 being arranged alternately with each of the gate regions 212A to 212C and the diode region 216 in the lateral direction.

A body block mask may be used to form the body regions 218. When the body implantation process is performed, the gate regions 212A to 212C and the first polysilicon portion 212-1 of the diode region 216 are covered by the body block mask to prevent the first polysilicon layer 212 filling the gate regions 212A to 212C and the first polysilicon portion 212-1 of the diode region 216 from being implanted with the P type impurities.

The implantation process above (or body implantation process) may also be used to form an impurity doped portion 214-2 that is formed within the second polysilicon portion 214-1 to increase the doping concentration of the second polysilicon portion 214-1. That is, the implantation process used to form the body regions 218 in the epi layer 204 is additionally used to form the impurity doped portion 214-2 in the second polysilicon portion 214-1 of the diode region 216. The P type impurities implanted into the N type epi layer 204 and the second polysilicon portion 214-1 of the diode region 216 may be driven in by diffusion after the implantation. Annealing may be used to facilitate the diffusion of impurities. The implantation and the subsequent diffusion steps are controlled so that the second polysilicon portion 214-1 is provided with the impurity doped portion 214-2 and a remaining second polysilicon portion 214-1A. In an embodiment, the impurity doped portion 214-2 has a doping concentration of about $1\times10^{17}/cm^3$ to about $1\times10^{18}/cm^3$. In an embodiment, the doping concentration of impurities in the impurity doped portion 214-2 is higher than the doping concentration of impurities in the second polysilicon layer 214.

A trench diode 250 is formed after the implantation process. The trench diode 250 includes the first polysilicon portion 212-1, the remaining second polysilicon portion 214-1A, and the impurity doped portion 214-2. The remaining second polysilicon portion 214-1A represents the remaining portion of the second polysilicon portion 214-1 after the body implantation is performed on the second polysilicon portion 214-1. Since the first polysilicon portion 212-1 has the N type conductivity, the remaining second polysilicon portion 214-1A has the P type conductivity, and the impurity doped portion 214-2 is formed by implanting the P type impurities into the second polysilicon portion 214-1, the trench diode 250 has a P-N junction formed by the first polysilicon portion 212-1 and the remaining second polysilicon portion 214-1A and impurity doped portion 214-2. Since the P type impurities are implanted into the second polysilicon portion 214-1 having the P type conductivity, the impurity doped portion 214-2 is relatively highly doped with the P type impurities. Therefore, the impurity doped portion 214-2 may be a P+ impurity region. The impurity doped portion 214-2 may be formed to provide the trench diode with more impurities to minimize the leakage problem or address the diffusion issue, or both.

In another embodiment, when the body implantation process is performed, the body block mask may also cover the second polysilicon portion 214-1 to be prevented from being implanted with the P type impurities. As a result, the trench diode 250 may be formed with only the first polysilicon portion 212-1 and the second polysilicon portion 214-1 without including the impurity doped portion 214-2, as illustrated in FIG. 1B. The formation of the impurity doped portion 214-2 may be skipped if the power device works well without a leakage problem and/or diffusion issue.

In FIG. 2F, the P type impurities are implanted into a part of the second polysilicon portion 214-1. However, in another embodiment, the P type impurities may be implanted and diffused into almost all parts of the second polysilicon portion 214-1, and thus almost all parts of the second polysilicon portion 214-1 may be converted into the impurity doped portion 214-2.

In an embodiment, a breakdown voltage of the trench diode 250 is controlled by adjusting a doping concentration of the P type impurities. The breakdown voltage of the trench diode 250 decreases as the doping concentration increases. In an embodiment, the doping concentration is in a range of $1 \times 10^{17}/cm^3$ to $1 \times 10^{18}/cm^3$ when the breakdown voltage is in a range of 3 V to 6 V.

After the body regions 218 and the trench diode 250 are formed, high impurity regions 220 are formed in upper portions of the body regions 218 below the insulating layer 210. The high impurity regions 220 include a material having the N type conductivity, and thus the high impurity regions 220 are N+ impurity regions. In an embodiment, the high impurity regions 220 are formed by an Arsenic implantation and diffusion process. In the process of forming the high impurity regions 220, the gate areas 212A to 212C and the trench diode 250 may be covered by a mask and be prevented from being implanted with the N type impurities during the implantation process. The high impurity regions 220 serve as source regions in an embodiment.

Figure 2G:
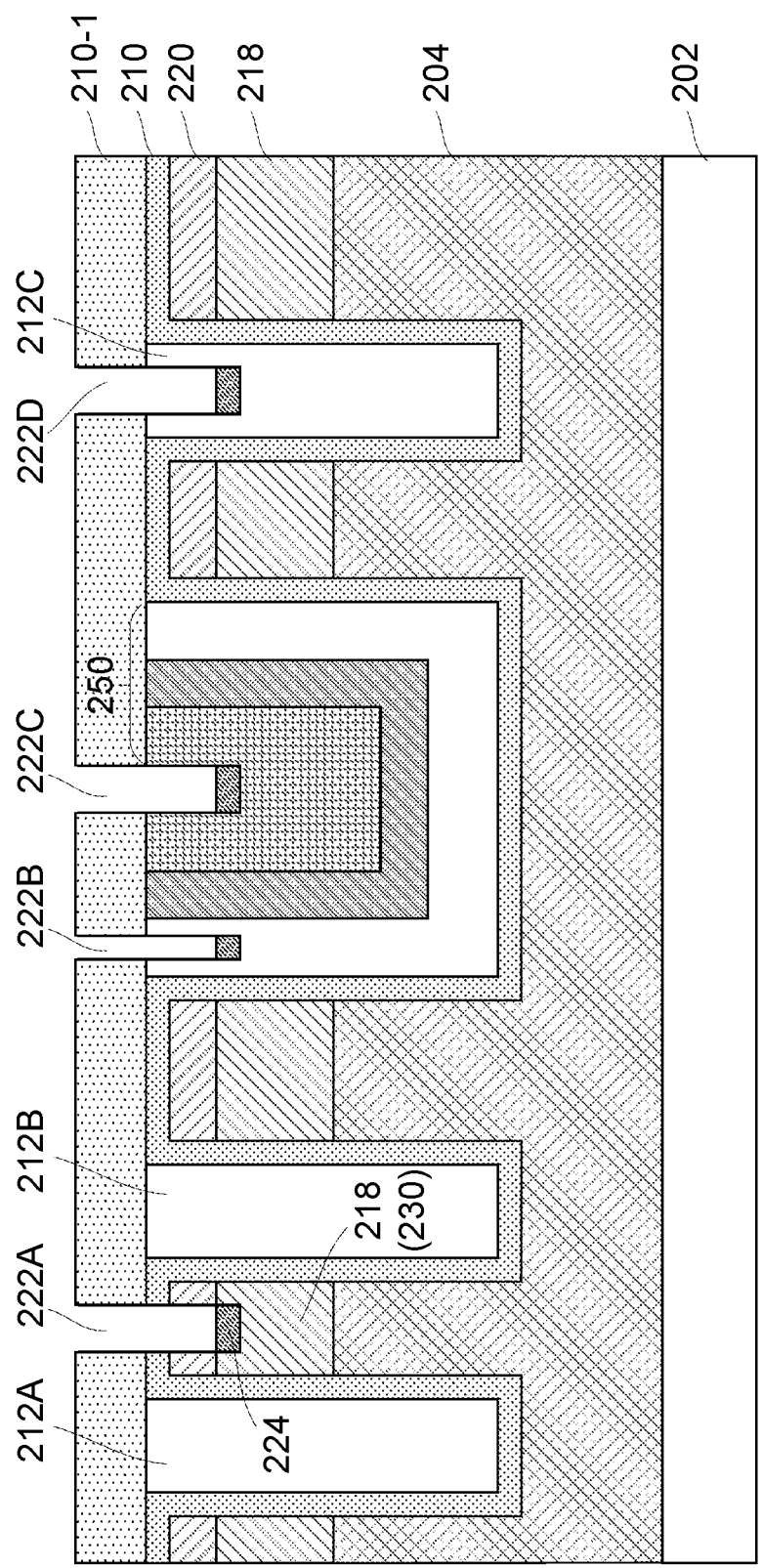

In FIG. 2G, an insulating material is deposited on a resultant structure of FIG. 2F after forming the high impurity regions 220, thereby forming an interlayer insulating layer 210-1. The insulating material may be the same material included in the insulating layer 210. After the interlayer insulating layer 210-1 is formed, contact holes 222A, 222B, 222C, and 222D are formed in the body region 218 (or source region 230) between the gate areas 212A and 212B, the first polysilicon portion 212-1 of the trench diode 250, the impurity doped portion 214-2 of the trench diode 250, and the gate region 212C (or gate structure 240) in the ESD area, respectively. The contact holes 222A, 222B, 222C, and 222D are formed by etching the interlayer insulating layer 210-1 and underlying layers of the interlayer insulating layer 210-1, such as the high impurity region 220, the first polysilicon portion 212-1 of the trench diode 250, and the impurity doped portion 214-2 of the trench diode 250, and the first polysilicon layer 212 in the gate region 212C. In the active area, the contact hole 222A is formed to expose the body region 218 (or source region 230) by etching the high impurity region 220.

Subsequently, Boron Ion Implantation is performed to form a junction layer 224 around the bottom of the contact holes 222A, 222B, 222C, and 222D. The junction layer 224 has the P type conductivity and has a higher impurity doping concentration than the body regions 218 to facilitate forming an Ohmic contact between a contact plug and the junction layer 224.

Figure 2H:
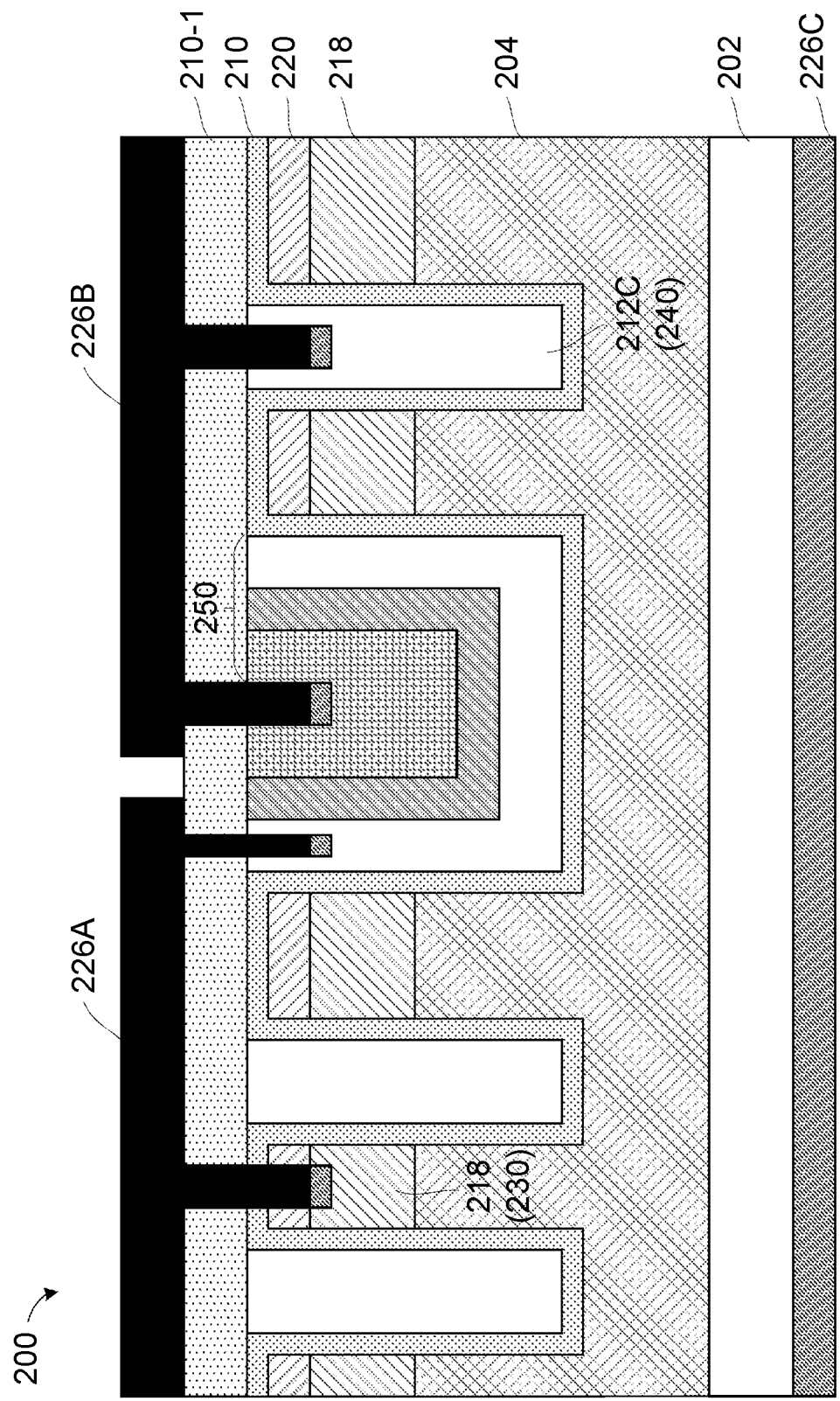

In FIG. 2H, metallization is performed on a resultant structure including the contact holes 222A, 222B, 222C, and 222D to connect the source region 230 in the active area, the trench diode 250, and the gate structure 212C in the ESD area. A conductive material such as aluminum is deposited into the contact holes 222A, 222B, 222C, and 222D and over the interlayer insulating layer 210-1, and then the deposited conductive material is patterned. By the patterning process, a source metal pattern (or source electrode) 226A connecting contact plugs disposed in the contact holes 222A and 222B is formed, and a gate metal pattern (or gate electrode) 226B connecting contact plugs disposed in the contact holes 222C and 222D is formed. As a result, the trench diode 250 is connected to and disposed between the source region 230 and the gate structure 240. A first end, e.g., a cathode, of the trench diode 250 is connected to the source region 230 through the source electrode 226A, and a second end, e.g., an anode, of the trench diode 250 is connected to the gate structure 240 through the gate electrode 226B. A drain electrode 226C is formed over the substrate 202 on the opposing side of the source electrode 226A.

The resulting power semiconductor device 200 of FIG. 2H corresponds to the power device 100 in FIG. 1A. The power device 200 shown in FIG. 2H may be a power MOSFET, IGBT, or the like according to implementation.

In the embodiments of the present disclosure, a trench diode is formed in an epi layer by sequentially performing a first polysilicon deposition process and a second polysilicon deposition process, the first polysilicon deposition process being the same as a process of forming a gate poly (or gate structure). Therefore, it is possible to simplify a manufacturing process of a power semiconductor device including the trench diode, and thus to reduce a process time and cost of the power semiconductor device.

In addition, since the trench diode is formed in the epi layer together with the gate structure, rather than over the gate structure, planarization can be much easily performed on a structure formed over the trench diode, compared to the conventional surface-formed diode that is constructed on a thick insulator after trench MOSFETs, e.g., gate polys, are formed.

Moreover, since the trench diode is formed in the epi layer and thus disposed under a thick insulating layer, e.g., an interlayer insulating layer disposed between the trench diode and a metal pattern, the trench diode has robustness to physical damage such as wire bonding.

Figure 3:
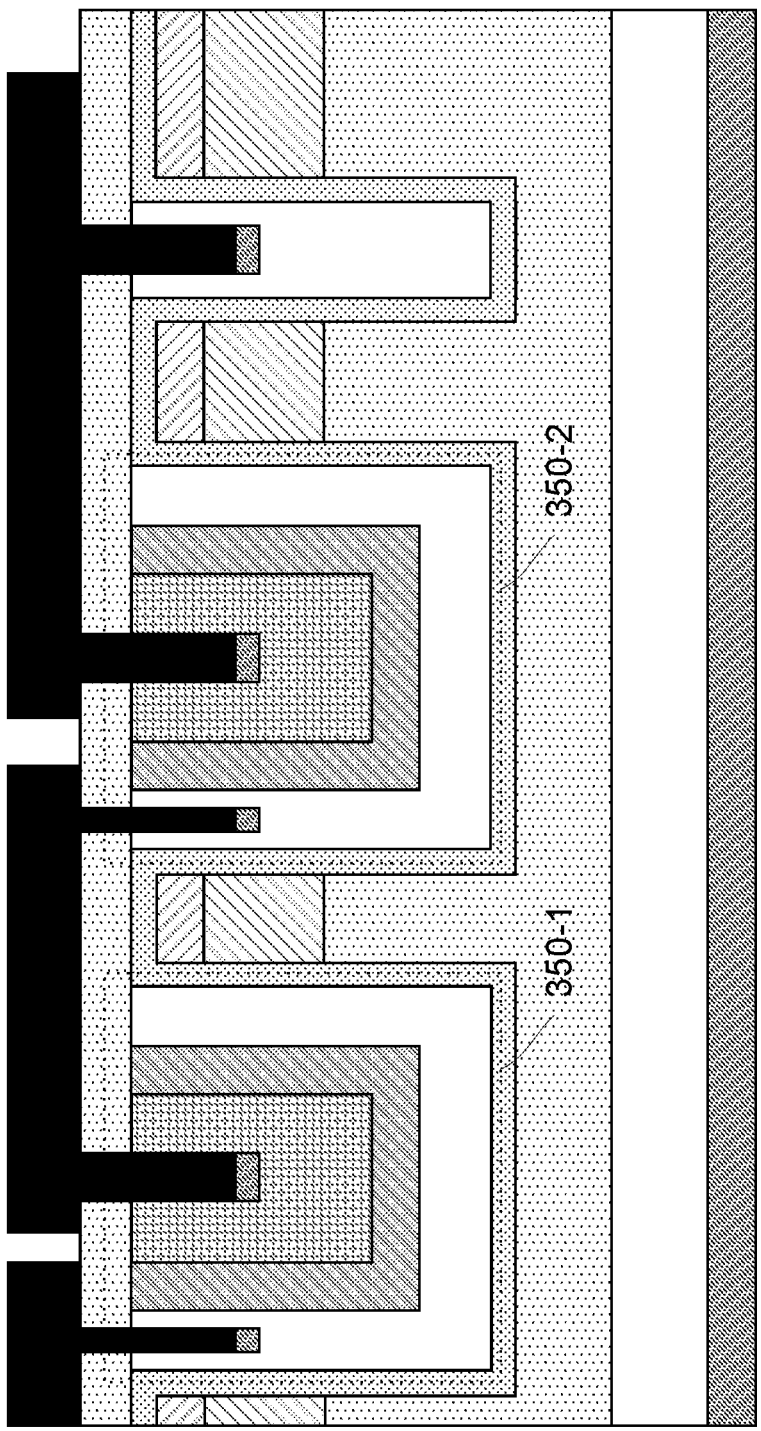
FIG. 3 illustrates a cross-sectional view of trench diodes connected in series according to an embodiment of the present disclosure.

FIG. 3 illustrates a cross-sectional view of a plurality of trench diodes connected in series according to an embodiment of the present disclosure. In FIG. 3, the plurality of trench diodes, e.g., two trench diodes 350-1 and 350-2, are connected in series between a source region in an active area and a gate structure in an ESD area. In an embodiment, a breakdown voltage (BV) of the trench diodes 350-1 and 350-2 may be additionally controlled by metal connection of the trench diodes 350-1 and 350-2 serially connected to each other. For example, one trench diode has a breakdown voltage of 5 V, a combination of two trench diodes serially connected to each other may have a breakdown voltage of 10 V (=5 V+5 V). That is, the breakdown voltage can be controlled by adjusting the number of trench diodes that are connected in series.

FIG. 4 is a plan view schematically illustrating a layout of a power semiconductor device according to an embodiment of the present disclosure. In FIG. 4, a plurality of trench diodes 450 are disposed between gate structures 412A in an active area A and a gate structure 412B in an ESD area E. In this embodiment, the trench diodes 450 has the same line type as the gate structures 412A and 412B. However, the shape of the trench diode 450 may be variously modified according to the shape of the gate structure.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A power semiconductor device, comprising:
   a gate structure defined in a first trench provided in a substrate material, the first trench having a first width;
   a diode defined in a second trench provided in the substrate material, the second trench having a second width that is wider than the first width;
   a first electrode provided over a first side of the substrate material and electrically coupled to a source region;
   a second electrode provided over the first side of the substrate material and electrically coupled to the diode, wherein the gate structure comprises a first portion of a first semiconductor material layer that fills the first trench, the first semiconductor material layer having a first conductivity type, and wherein the diode comprises:
- a second portion of the first semiconductor material layer that is provided along an entire profile of the second trench in order to cover sidewalls and a bottom of the second trench, and
- a second semiconductor material layer of a second conductivity type provided within the second trench and covering exposed sidewalls and a lower surface of the second portion of the first semiconductor material layer in the second trench, the second conductivity type being different from the first conductivity type.

2. The power semiconductor device of claim 1, wherein the gate structure is provided in an active area of the power semiconductor device and the diode is provided in a peripheral area of the power semiconductor device.

3. The power semiconductor device of claim 1, further comprising:
- a third electrode provided over a second side of the substrate material, the second side being in an opposing side of the first side,
- wherein the power semiconductor device includes a MOSFET device, the first electrode is a source electrode, and the third electrode is a drain electrode.

4. The power semiconductor device of claim 1, wherein the diode further comprises:
- a third semiconductor material layer of the second conductivity type provided within the second trench and covering exposed sidewalls and a lower surface of the second semiconductor material layer, the third semiconductor material layer having a higher doping concentration than that of the second semiconductor material layer.

5. The power semiconductor device of claim 1, wherein the first semiconductor material layer has a doping concentration of at least $1\times10^{18}/cm^3$ and the second semiconductor material layer has a doping concentration of at least $1\times10^{17}/cm^3$.

6. The power semiconductor device of claim 1, wherein the first semiconductor material layer is polysilicon having the first conductivity type, and the second semiconductor material layer is polysilicon having the second conductivity type.

7. The power semiconductor device of claim 1, wherein the substrate material includes an epi layer and the first and second trenches are provided in the epi layer.

8. The power semiconductor device of claim 1, wherein the diode is a Zener trench diode, the Zener trench diode comprising:
- an insulating layer provided over the sidewalls and the bottom of the second trench;
- the second portion of the first semiconductor material layer of the first conductivity type provided within the second trench and disposed over the insulating layer; and
- the second semiconductor material layer of the second conductivity type provided within the second trench and disposed over the second portion of the first semiconductor material layer in the second trench.

9. The power semiconductor device of claim 8, wherein the Zener trench diode further comprises:
- a third semiconductor material layer of the second conductivity type provided within the second trench and over the second semiconductor material layer, the third semiconductor material layer having a higher doping concentration than that of the second semiconductor material layer.

10. The power semiconductor device of claim 8, wherein the first semiconductor material layer has a doping concentration of at least $1\times10^{18}/cm^3$ and the second semiconductor material layer has a doping concentration of at least $1\times10^{17}/cm^3$.

* * * * *